United States Patent
Okumura

(10) Patent No.: US 7,473,657 B2
(45) Date of Patent: Jan. 6, 2009

(54) LASER IRRADIATION METHOD AND APPARATUS FOR FORMING A POLYCRYSTALLINE SILICON FILM

(75) Inventor: Hiroshi Okumura, Kanagawa (JP)

(73) Assignee: NEC LCD Technologies, Ltd. (JP)

(*) Notice: Subject to any disclaimer, the term of this patent is extended or adjusted under 35 U.S.C. 154(b) by 232 days.

(21) Appl. No.: 11/361,756

(22) Filed: Feb. 24, 2006

(65) Prior Publication Data

US 2006/0194354 A1    Aug. 31, 2006

(30) Foreign Application Priority Data

Feb. 28, 2005    (JP) .............................. 2005-053921

(51) Int. Cl.
H01L 21/263 (2006.01)
(52) U.S. Cl. ........................ 438/795; 438/16
(58) Field of Classification Search ................ 438/795, 438/487, 7, 16, 488; 219/121.66
See application file for complete search history.

(56) References Cited

U.S. PATENT DOCUMENTS

| 6,372,039 B1 * | 4/2002 | Okumura et al. ................ 117/8 |
| 6,815,269 B2 | 11/2004 | Okumura ..................... 438/149 |
| 6,815,377 B2 * | 11/2004 | Mitsuhashi et al. ......... 438/795 |
| 6,922,243 B2 | 7/2005 | Lin et al. |
| 7,135,389 B2 * | 11/2006 | Yamazaki et al. ........... 438/487 |
| 7,232,982 B2 * | 6/2007 | Takami ..................... 250/208.1 |

FOREIGN PATENT DOCUMENTS

| CN | 1501465 | 6/2004 |
| CN | 1553477 | 12/2004 |
| JP | 10-144621 | 5/1998 |
| JP | 2000-114174 | 4/2000 |
| JP | 2002-8976 | 1/2002 |
| JP | 2002-009012 | 1/2002 |
| JP | 2003-332346 | 11/2003 |
| TW | 200303584 | 9/2003 |

OTHER PUBLICATIONS

Shih C-J and Lu I-M, Spectroscopic Analysis in Laser Annealing LT poly-Si TFTs, 1999, Information Display ASID 1999, p. 93-99. ISBN 957-9734-7-8.*

Chu-Jung Shih, et al., "Spectroscopic Analysis in Laser Annealing LT poly-Si TFTs", ASID'99, pp. 93-99.

* cited by examiner

Primary Examiner—Wael Fahmy
Assistant Examiner—Eva Montalvo
(74) Attorney, Agent, or Firm—Hayes Soloway P.C.

(57) ABSTRACT

A method for changing an amorphous silicon film to a polycrystalline silicon film includes the steps of irradiating an elongate pulse laser beam onto the silicon film while scanning in the direction normal to the major axis of the elongate pulse laser beam, to form a plurality of irradiated areas, irradiating flat-surface light onto the irradiated areas in the direction parallel to the major axis, and analyzing distribution of the reflected light from the irradiated areas to determine the threshold value of micro-crystallization. The threshold value is used to further determine an energy density of the elongate pulse laser beam for the phase change process.

9 Claims, 7 Drawing Sheets

LASER IRRADIATION METHOD AND APPARATUS FOR FORMING A POLYCRYSTALLINE SILICON FILM

TECHNICAL FIELD

The present invention relates to a laser irradiation method and a laser irradiation apparatus, and more specifically, to a laser irradiation method adopted in a laser annealing process to form a polycrystalline silicon (poly-Si) thin film by irradiating a laser beam onto a silicon film, and a laser irradiation apparatus adopting such a laser irradiation method.

BACKGROUND ART

In recent years, as a thin-film device to form an integrated circuit on a glass substrate, poly-Si TFTs (thin film transistors) have been vigorously developed. The poly-Si film is generally formed in an excimer laser crystallization technique. In this technique, an amorphous silicon (a-Si) film is once formed, and an excimer laser beam is irradiated onto the a-Si film to melt and re-crystallize the a-Si film, to form the poly-Si film. In the excimer laser crystallization technique, the molten state of the a-Si film depends on the film thickness thereof, optical constant of the film, wavelength of the excimer laser beam, energy density, pulse width, beam profile, and the like. In general, the laser irradiation process management deals with thickness of the a-Si film and energy density of the laser irradiation apparatus as targets to be managed. This is because the molten state which should essentially be managed is difficult to evaluate and manage.

In the molten state of the a-Si film, the depth of melt increases depending on the energy density of the laser beam. Significant phases in changes of the molten state appear at two points. One is the phase in which the film surface starts melting. The other is the phase in which the whole film completely melts once the melt depth reaches the full thickness of the film. The former and latter molten states bring about crystallization and micro-crystallization, respectively. Film temperature rises due to laser beam irradiation, and a part of the film melts. Then, the molten area or part is crystallized by later cooling. If the film does not completely melt, the nucleation sites during the crystallization in a solid-liquid interface. If, on the other hand the depth of melt equals the film thickness, the nucleation sites form in a-Si/substrate interface. In any case, crystallization is associated by heterogeneous nucleation. At this time, the grain diameter increases depending on the increase in the energy density. TFT characteristics and particularly the mobility thereof depend on the grain diameter. Hence, the grain diameter has been required to become as large as possible.

On the other hand, however, when a film completely melts, the mechanism of crystallization from a liquid phase, which has reached a thermal equilibrium state, changes into a homogeneous nucleation in which the nucleation occurs throughout the film. The grain diameter of crystal grains formed at this time is as small as 20 nm. A phenomenon of rapid reduction in the grain diameter which appears when energy density is excessively increased is called micro-crystallization. The energy density at which the micro-crystallization occurs is referred to as micro-crystallization threshold value. In a physical meaning, the micro-crystallization threshold value is a parameter which standardizes the change in film thickness, energy density, and the like together, and can evaluate the changes in the molten state. Besides, the micro-crystallization threshold value is a highly important value from the viewpoint of practical use that irradiation with higher energy density than the threshold value adversely reduces the grain diameter and degrades the TFT characteristics. It is to be noted that, as the film thickness decreases, the cooling period is shortened. Accordingly, solidification ends within the incubation time of the nucleation, and amorphous fraction is caused in some cases. This amorphous fraction may be included in the term of micro-crystallization, and referred to as micro-crystallization as well in this text.

Techniques of adjusting the output of a laser beam irradiated in the laser annealing process to be smaller than the threshold value of micro-crystallization of an a-Si film are described in Patent Publications JP-A-2000-114174 and JP-A-2002-8976.

FIG. 9 shows analysis of an irradiated area described in JP-A-2000-114174, wherein the irradiated area is analyzed by using an exciting laser 32. This publication teaches that, at first, a preliminary irradiation area is formed by irradiating a one-shot pulse laser beam onto a substrate 31 on which an a-Si film is formed, with the energy density being changed in a pulse-by-pulse basis. Thereafter, the exciting laser 32 is irradiated to obtain reflected scattered light 34 and determine whether or not the micro-crystallization has occurred, by using a Raman spectroscope 33 from the intensity of the scattered light 34 reflected from the poly-Si portions in the a-Si film irradiated with the one-shot pulse laser.

According to the technique described in JP-A-2000-114174, the micro-crystallization threshold value of the a-Si film is checked by this kind of a preliminary irradiation process. An energy density smaller than the micro-crystallization threshold value is then determined as the energy density of a laser beam to be irradiated in the main irradiation process on the a-Si film in the area where TFTs are to be formed in the poly-Si film converted from the a-Si film.

Meanwhile, there has been a proposal for a technique of controlling positions of crystal grains in which a laser beam having an energy density not smaller than the micro-crystallization threshold value of the a-Si film is intentionally irradiated (see JP-A-2003-332346), unlike the general laser irradiation techniques. In this case, determination of the micro-crystallization threshold value is also highly important in order to form crystal grains whose positions are steadily controlled.

DISCLOSURE OF THE INVENTION

Problems to be solved by the Invention

Micro-crystallization threshold value determination techniques described in JP-A-2000-114174 and JP-A-2002-8976 involve several problems as will be described hereinafter. The first problem is that the technique of irradiating a laser beam differs between a main irradiated area and a preliminary irradiation area, and the micro-crystallization threshold value is difficult to be accurately determined.

Specifically, a scanning irradiation technique in which irradiation is performed while shifting a laser irradiation position is adopted for the main irradiated area. On the other hand, one-shot pulse irradiation is adopted for the preliminary irradiation area By using the one-shot pulse irradiation, the micro-crystallization threshold value of an a-Si thin film is determined. However, the micro-crystallization threshold value of a poly-Si thin film which has once been crystallized is significant for the scanning irradiation. This is because, a the scanning irradiation, a poly-Si area which has been crystallized by a previous pulse along with another a-Si area leading the poly-Si area is irradiated with a next pulse.

In general, the scanning irradiation involves an overlapping rate of 90% or higher for the adjacent pulses, and therefore, the irradiated area is substantially the poly-Si area. A poly-Si thin film has an optical coefficient and a melting point which are different from those of the a-Si film. Therefore, the micro-crystallization threshold value of the poly-Si thin film is raised compared with that of the a-Si film. Thus, the micro-crystallization threshold value for one-shot irradiation and another micro-crystallization threshold value for scanning irradiation have different meanings and involve different numerical values.

Although estimation of the micro-crystallization threshold value of a poly-Si film from the micro-crystallization threshold value of an a-Si film is not impossible, the micro-crystallization threshold value of the poly-Si film obtained by such estimation lacks accuracy. In addition, in the main irradiation process, execution of scanning irradiation taking as an upper limit the micro-crystallization threshold value of the a-Si thin film determined by one-shot irradiation means that execution of scanning irradiation with a lower energy density than an energy density level at which a structure with a larger grain diameter will have been produced. This is a disadvantage from the viewpoint of TFT mobility.

Also, in general, the range of pulse energy variation of an excimer laser irradiation apparatus may reach ±10% or more. Particularly in an initial stage of pulse generation, gas circulation speed and gas tube temperature are not stable, whereby a larger range of variation is produced. However, after continuous pulse generation for a particular constant time period, the apparatus comes into an equilibrium state. Thereafter, stable pulse generation is performed with variation in a range of ±3% or so until the lifetime of a gas expires. Thus, one-shot irradiation which repeatedly switches on and off the pulse generation results in a markedly poor pulse generation stability. By using this kind of one-shot irradiation having a larger range of variation, the micro-crystallization threshold value cannot be determined with a satisfactory reliability.

The second problem lies in that the incident direction of the estimation light used to determine the micro-crystallized state is not taken into consideration. In general, a laser beam is shaped into a one-dimensional linear shape or elongate shape, and therefore, the uniformity of crystal structure of the poly-Si thin film is caused to have an anisotropic characteristic. Also, the scanning irradiation technique causes the crystal structure to involve therein periodic change in the minor-axis direction of the elongate beam, which is the scanning direction. Consequently, the incident direction of estimation light is significant to determine the micro-crystallization threshold value with a higher reliability. However, conventional techniques do not consider the significance of the incident direction.

In view of the above problems in conventional techniques, it is an object of the present invention to provide a laser irradiation method and a laser irradiation apparatus capable of determining the micro-crystallization threshold value with excellent reliability and reproducibility and also capable of forming a high-performance crystallized thin film with excellent reliability and reproducibility.

Means for solving the Problems

The present invention provides a method for changing a phase of a semiconductor layer from an amorphous state to a crystallized state, including the steps of: irradiating an elongate first pulse laser beam having a specific generation frequency onto a semiconductor layer with a plurality of different energy densities while scanning in a direction normal to a major axis of the first pulse laser beam, to thereby form a plurality of first irradiated areas corresponding to the different energy densities; irradiating a flat-surface light onto the irradiated areas in a direction substantially parallel to the major axis of the first pulse laser beam, to receive reflected light from each of the first irradiated areas; analyzing the reflected light to estimate a threshold value of a micro-crystallization energy density; determining a first energy density based on the estimated threshold value; and irradiating an elongate second pulse laser beam having the specific generation frequency onto the semiconductor layer with the first energy density while scanning in a direction normal to a major axis of the second pulse laser beam, to form a second irradiated area.

The present invention also provides a laser irradiation apparatus using the method of the present invention as described above. The apparatus includes: a laser light source for generating a pulse laser beam; an optical system for converting the pulse laser beam into the elongate pulse laser bead; a moving device for scan-moving a substrate table relative to the elongate pulse beam in a direction normal to the major axis of the elongate pulse laser beam; a flat-surface light source for irradiating the flat-surface light in a direction parallel to the major axis of the elongate pulse laser beam; and a light-sensitive device for receiving the flat-surface light reflected from the semiconductor layer.

According to the laser irradiation method and apparatus of the present invention, the threshold value of micro-crystallization is determined based on the reflected light of the flat-surface light from the first irradiated areas formed by the first pulse laser having the specific generation frequency. Based on the determined threshold value of micro-crystallization, an energy density is determined for the second pulse laser beam to be irradiated onto main irradiating process to form the second irradiated area. Therefore, on the second irradiated area, the surface of the substrate can be crystallized with superior reliability and reproducibility.

Also, when the threshold value of micro-crystallization is determined, the flat-surface light is incident in the direction substantially parallel to the major axis of the elongate pulse laser beam to receive the reflected light from the first irradiated areas. Since changes in the micro-crystallized structure which appear periodically in the minor-axis direction of the beam are detected with higher accuracy by analyzing the reflected light, the micro-crystallization threshold value can be determined extremely accurately.

Preferably in the laser irradiation technique of the present invention, the scanning pitch (moving pitch) of the first pulse laser beam in each of the first irradiated areas is longer than the scanning pitch of said second pulse laser beam in the second irradiated area. In this case, the throughput can be raised more in comparison with another case where the moving distance per pulse in the first irradiated areas is set equal to the moving distance per pulse in the second irradiated area.

Also preferably in the laser irradiation technique of the present invention, the first pulse laser beam has a beam size smaller than a beam size of the second pulse laser beam. The area where the first irradiated areas are formed are not finally used for products or the like. Accordingly, by making the area not used for products smaller, the second irradiated area to be used in the main irradiation can be larger.

In the laser irradiation technique of the present invention, the threshold value may be estimated based on a periodicity of the reflected light in the determining step. In an alternative, the threshold value may be estimated by the steps of: determining a color distribution from the reflected light in a direction normal to the major axis of the first pulse laser beam, and judging a distance between adjacent peaks of color change and/or uniformity of the color change. In the first irradiated areas formed with energy densities equal to or higher than the threshold value of micro-crystallization, the micro-crystallized areas appear periodically, and reflected light shows the periodic changes. Therefore, the threshold value of micro-crystallization can be obtained by detecting such periodic changes.

In the laser irradiation technique of the present invention, the threshold value may be estimated by the steps of determining a color distribution from the reflected light in a direction normal to the major axis, and a width of a color in the color distribution. For example, when resolution of received reflected light is coarser than the period of periodically formed micro-crystallized areas, clear periodicity cannot be recognized from the reflected light sometimes. In this case, the threshold value of micro-crystallization can be obtained by observing changes the width of colors in the distribution of the reflected light.

According to the laser irradiation technique and apparatus of the present invention, the threshold value of micro-crystallization is determined based on the reflected light of the flat-surface light reflected from the first irradiated areas. An energy density is determined based on the threshold value of micro-crystallization for the main irradiation for irradiating the laser beam onto the second irradiated area, to suitably crystallize the second irradiated area. As a result, the surface of a substrate can be crystallized with superior reliability and reproducibility. By thus crystallizing the surface of a substrate with superior reliability and reproducibility, characteristics of products can be improved and the manufacturing yield of products can be increased. In addition, by automatically determining the threshold value of micro-crystallization, the manufacturing throughput of products can be increased.

According to the laser irradiation technique and apparatus of the present invention, the estimation light is incident in the direction substantially parallel to the major axis of the scanning pulse laser beam, to receive and analyze the reflected light of the estimation light from the first irradiated areas. This allows detection of the micro-crystallized structure with a higher accuracy, as a result of which the threshold value of micro-crystallization can be exactly determined. By setting the scanning pitch of the scanning in the first irradiated areas to be larger than that to be used in the main irradiation in the laser irradiation technique and apparatus of the present invention, the throughput in scanning irradiation on the first irradiated areas can be improved. Alternatively, by using the first pulse laser beam having a size smaller than the size of the second pulse laser beam, the first irradiated areas can be made smaller to increase the area for the main irradiation. Accordingly, the yields of products can be improved.

DETAILED DESCRIPTION OF THE PREFERRED EMBODIMENT(S)

Figure 1:
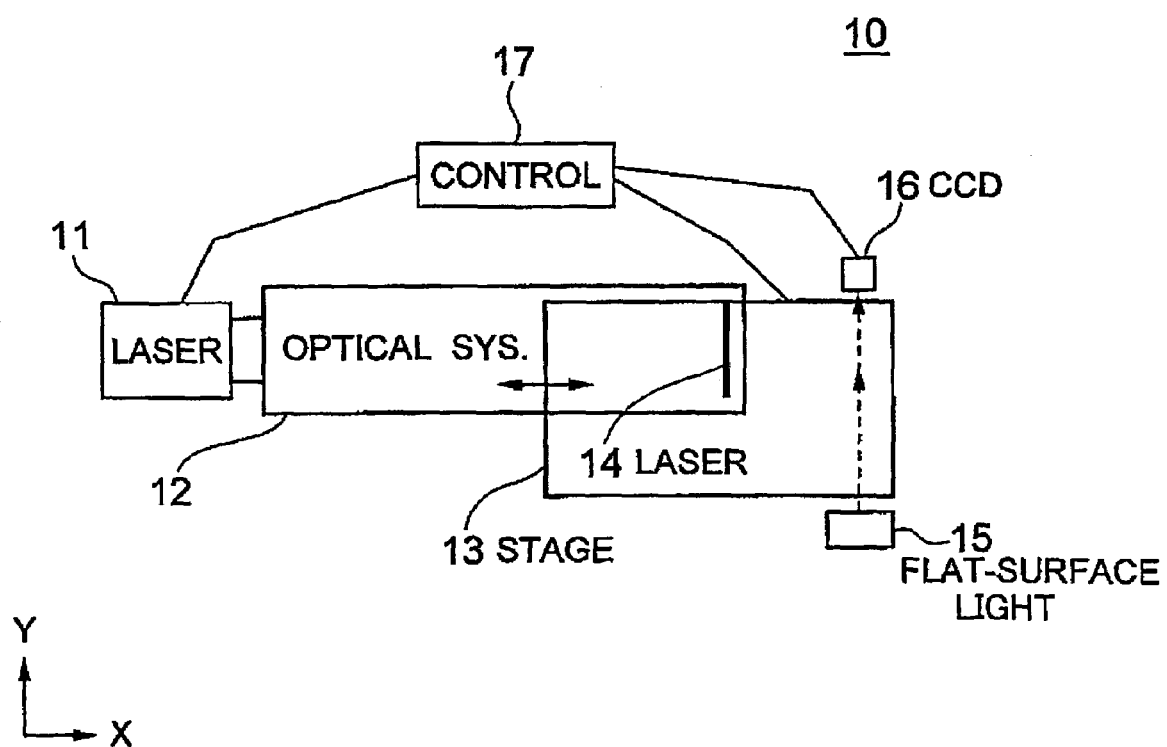
FIG. 1 is a block diagram showing the structure of a laser irradiation apparatus according to an embodiment of the present invention.

Embodiments of the present invention will now be described below with reference to the drawings. FIG. 1 shows the structure of a laser irradiation apparatus according to an embodiment of the present invention. The laser irradiation apparatus, generally designated by numeral 10, has a laser light source 11, an optical system 12, a substrate stage 13, a white flat-surface light source 15, a CCD light-sensitive element 16, and a control system 17. The laser irradiation apparatus 10 is used to change an a-Si film formed on a substrate into a poly-Si film in a manufacturing process for manufacturing TFTs and the like.

The control system 17 controls the other sections of the laser irradiation apparatus 10. The laser light source 11 generates pulse laser light. The optical system 12 converts the laser light generated by the laser light source 11 into a linearly-shaped beam or elongate beam. On the substrate stage 13, a substrate to be irradiated with a linear laser beam 14 transmitted through the optical system is placed. The substrate stage 13 is capable of moving the substrate placed thereon in the minor-axis direction of the laser beam, which is referred to as herein X-direction. The white flat-surface light source 15 irradiates the substrate 18 with flat-surface light. The CCD light-sensitive element 16 receives the reflected light reflected on the substrate 18. The white flat-surface light source 15 and the CCD light-sensitive element 16 are placed opposed to each other in a direction substantially parallel to the major-axis direction of the laser beam 4 converted into a linear shape by the optical system 12. The major-axis direction is referred to as herein Y-direction.

Figure 2:
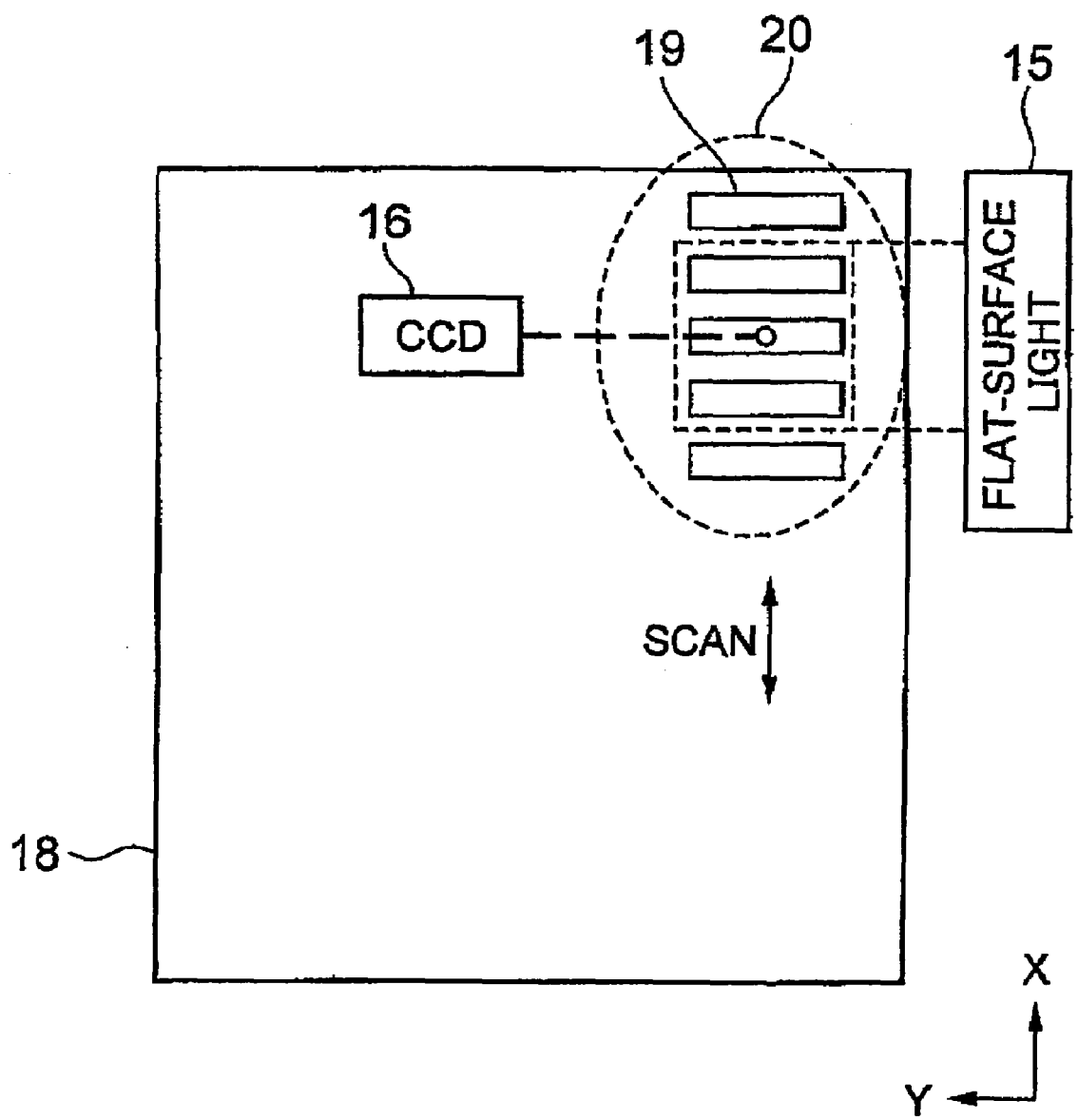
FIG. 2 is a plan view showing a substrate irradiated with a laser beam by the laser irradiation apparatus.

FIG. 2 shows the substrate 18 in a top plan view in the state where the substrate 18 is irradiated with a laser beam by the laser irradiation apparatus 10. On the surface of the substrate 18, an a-Si film is formed beforehand. Prior to irradiation of the laser beam onto a portion of the a-Si film to fabricate TFTs thereon, the laser irradiation apparatus 10 irradiates a laser beam onto a preliminary irradiation area 20 of the substrate 18, with the energy density of the laser beam being continuously and finely changed, to thereby form a plurality of irradiated areas 19 corresponding to the different energy densities. The CCD light-sensitive element 16 selects the inside of the irradiated areas 19 as measurement areas (image-pickup areas), and receives the reflected light from these irradiated areas. The white flat-surface light source 15 uniformly irradiates flat-surface light onto a range sufficiently broader than the image pickup areas of the CCD light-sensitive element 16. In the present embodiment, distributions of colors of the reflected light from the irradiated areas 19, which the CCD light-sensitive element 16 has received, is evaluated to determine the micro-crystallization threshold value.

Figure 3:
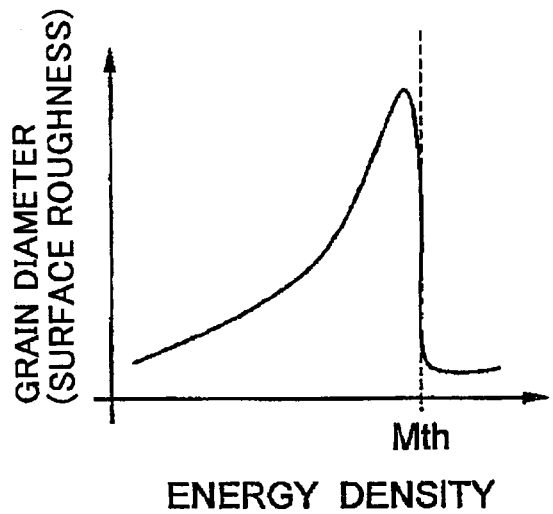
FIG. 3 is a graph showing a relationship between energy density of a laser beam and a poly-Si crystal grain diameter and surface roughness.

FIG. 3 is a graph showing the relationship between the energy density of the laser beam and the grain diameter of the poly-Si crystal as well as the surface roughness of the poly-Si. In the beginning, the grain diameter and surface roughness increase as the energy density rises, as shown in the figure. However, when the energy density exceeds the micro-crystallization threshold value (Mth), the grain diameter and surface roughness rapidly decrease. This means that the reflected direction and reflectance with respect to the incident light, when the light is irradiated onto the poly-Si film, largely change at the micro-crystallization threshold value as a boundary.

Figure 4:
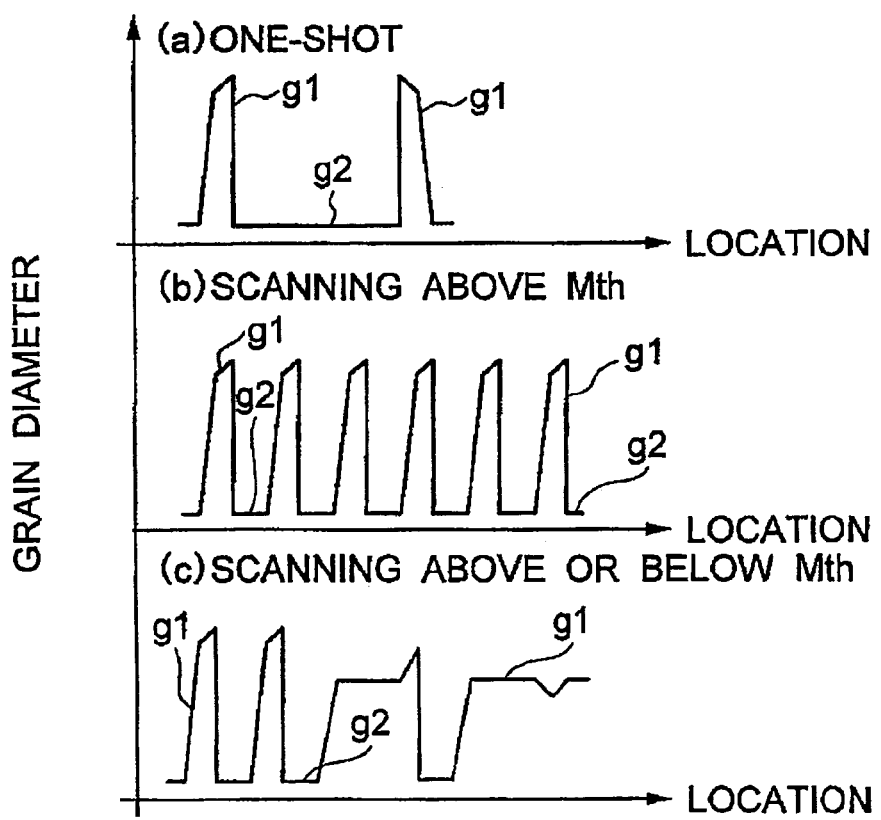
FIG. 4 depicts a graph showing the grain diameter (surface roughness) at each position of the substrate after laser irradiation in different cases of irradiation.

FIG. 4 depicts a graph showing the grain diameter (surface roughness) at each position of the substrate after laser irradiation in different cases of irradiation. In FIG. 4, graph (a) shows how the grain diameter changes when a laser beam is irradiated by one-shot irradiation with an energy density not smaller than the micro-crystallization threshold value. Graphs (b) and (c) each show how the grain diameter changes when a laser beam is irradiated by scanning irradiation. In actual laser irradiation, the edge portion of a pulse laser beam inevitably involves an area where the energy density is not larger than the threshold value even when the laser pulse is irradiated with an energy density not smaller than the micro-crystallization threshold value. Therefore, in the one-shot irradiation, as shown in graph (a), a portion (g1) consisting of the coarse crystal grains appear in the vicinity of each edge portion of the micro-crystallized portion (g2).

When the scanning irradiation is performed with an energy density not smaller than the micro-crystallization threshold value, portions of the coarse crystal grains formed by a leading beam edge of a scanning pulse is micro-crystallized by another scanning pulse succeeding to the aforementioned scanning pulse. Thus, as shown in the graph (b) in FIG. 4, portions (g1) of the coarse crystal grains and the micro-crystallized portions (g2) appear alternately, the portions (g1) of the coarse crystal grains being formed by the trailing edge of the succeeding scanning pulse. Thus, periodic changes in grain diameter occur according to the scanning pitch.

On the other hand, when the energy density is slightly lowered so that the micro-crystallization threshold value is included in the range of intensity variation in pulse generation, i.e., if the micro-crystallization threshold value is exceeded sometimes and not exceeded other times depending on the irradiated pulses, cases in which micro-crystallization occurs and other cases in which micro-crystallization does not occur appear non-periodically. Thus, periodicity of changes in grain diameter breaks, wherein the micro-crystallized portions (g2) appear depending on the intensity of the irradiated pulses, as shown in the graph (c) in FIG. 4. This means the micro-crystallization threshold value can be determined by evaluating changes in the grain diameter and the periodicity of the portions.

Figure 5:
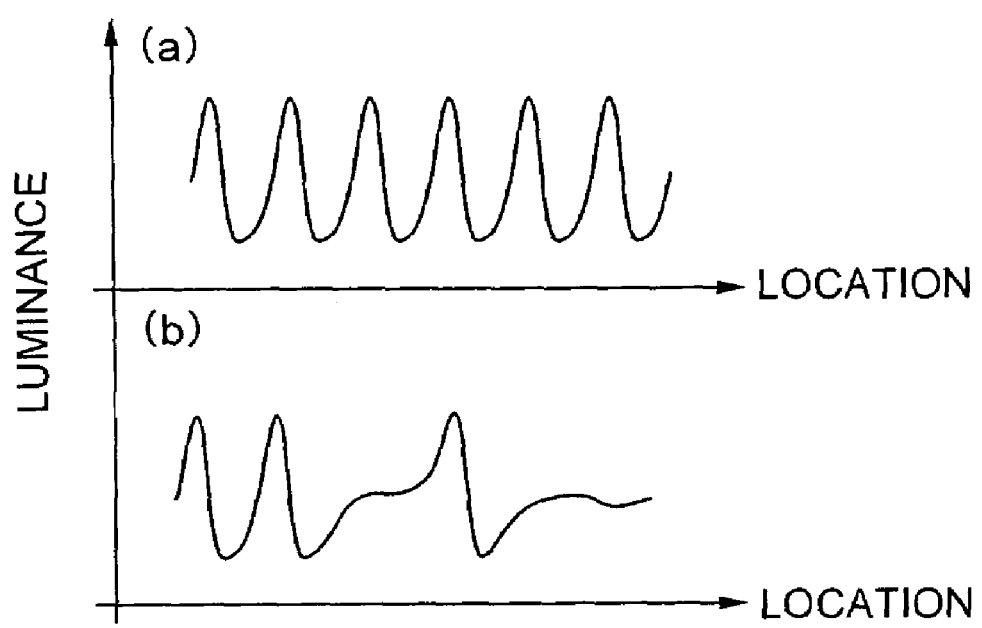
FIG. 5 depicts a graph showing the change in luminance of the reflected light received by the CCD light-sensitive element.

FIG. 5 shows changes in luminance of a reference color of the light received from the irradiated area by the CCD light-sensitive element 16. Graphs (a) and (b) correspond to graphs (b) and (c), respectively, in FIG. 4. The irradiated areas 19 are prepared by performing scanning irradiation to obtain the grain diameters shown in FIG. 4B. Reflected light from the irradiated areas 19 is received by the CCD light-sensitive element 16. In this case, when the optical resolution of the CCD light-sensitive element 16 is smaller than the width of the portion g1 of the coarse crystal grains in the scanning direction, the luminance of the reference color of light received by the CCD light-sensitive element 16 clearly differs between micro-crystallized portions g2 and portions g1 of the coarse crystal grains, as shown in the graph (a) shown in FIG. 5.

On the other hand, if the scanning irradiation is performed to obtain the state shown in the graph (c) in FIG. 4, periodicity of changes in color peaks as shown in the graph (b) in FIG. 5. Accordingly, the micro-crystallization threshold value can be determined by evaluating peaks of changes in color corresponding to the portions of the coarse crystal grains, distances between peaks, and a range of variation thereof.

Figure 6A:
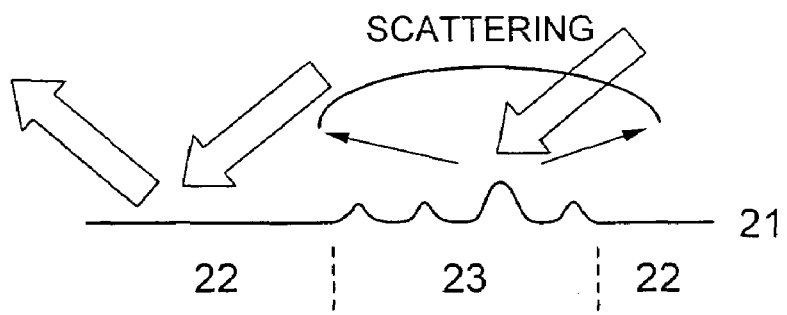
FIG. 6A is a schematic sectional view showing the scattering of light, FIGS. 6B and 6C each are a schematic diagram showing an image of the CCD light-sensitive element.

A case wherein the laser light is incident substantially in parallel with the minor axis of the beam will now be taken into consideration. FIG. 6A shows a sectional view of the irradiated area 19 taken along the minor axis of the beam. As shown in FIG. 6A, a portion 23 of the coarse crystal grains and the micro-crystallized portions 22 are formed on a poly-Si film surface 21 in the irradiated area. If the light is incident onto the poly-Si film surface 21 substantially in parallel with the minor axis of the beam, reflected light from the micro-crystallized portions 22 and other reflected light from the portions 23 of the coarse crystal grains are mixed with each other due to the influence from portions 23 of the coarse crystal grains which appear periodically and have surface roughness.

Figures 6B, 6C:
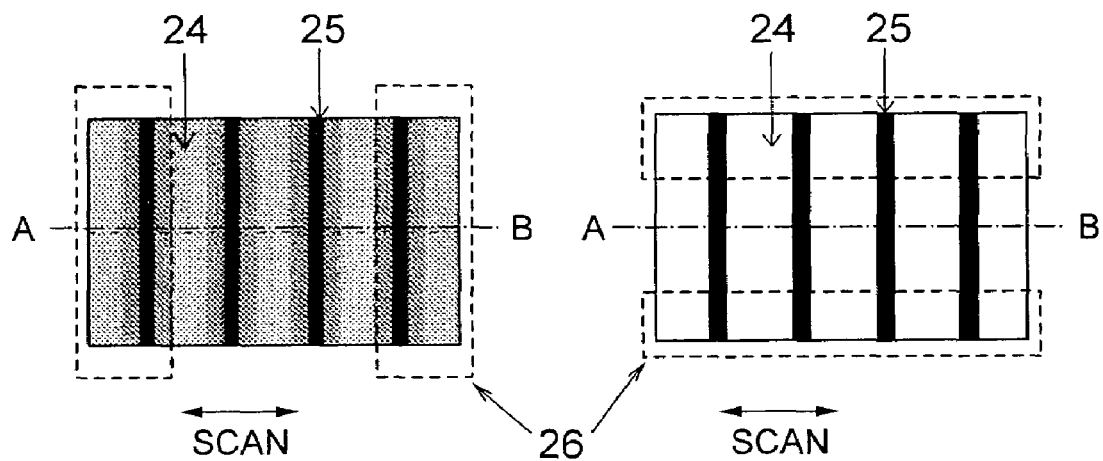
FIG. 6D is a graph showing color changes observed corresponding to FIGS. 6B and 6C.

Suppose that the estimation light is irradiated in the direction parallel to the minor-axis direction of the beam, and the reflected light from the irradiated area 19 is received by the CCD light-sensitive element 16. Then, as schematically shown in FIG. 6B, bleeding or mixture of colors occurs at the boundary between the micro-crystallized portions 24 and the portions 25 of the coarse crystal grains, rendering these boundaries unclear. If the estimation light is received obliquely, the optical path length changes at end portions of images due to the influence of the CCD depth of focus, so that the base line of colors changes. Therefore, the area 26 where the color changes appears. Suppose, on the other hand, that the light is irradiated in the direction parallel to the major axis of the beam, and the reflected light from the irradiated area 19 is received by the CCD light-sensitive element 16. Then, the boundaries between the micro-crystallized portions 24 and the portions 25 of the coarse crystal grains are clear.

Figure 6D:
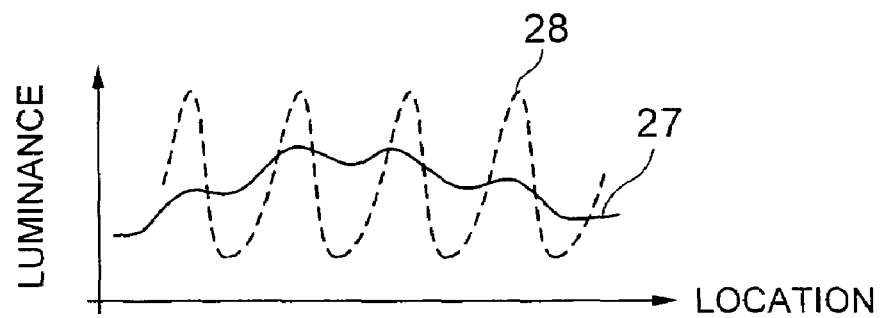

FIG. 6D is a graph showing the color changes of a reference color in the direction A-B in FIGS. 6B and 6C. As a result of optical influences, the luminance of the reference color changes as drawn by graphs 27 and 28 in FIG. 6D, along segments AB parallel to the minor-axis (or scanning) direction of the beam on CCD images in FIGS. 6B and 6C. When the graphs 27 and 28 are compared with each other, no clear periodicity is observed from the graph 27. However, a clear periodicity can be determined from the graph 28. An evaluation hence needs to be made by allowing the light to enter in the direction substantially parallel to the major axis of the beam, in order to determine the micro-crystallization threshold value with sufficient reliability and reproducibility.

In the present embodiment, a plurality of irradiated areas 19 are prepared while changing the energy density during the scanning irradiation. The irradiated areas 19 are further irradiated with flat-surface estimation light, to determine the threshold value of micro-crystallization of a poly-Si film. Based on this determined threshold value of micro-crystallization, the energy density to be adopted in the main irradiation for poly-crystallization is determined and the main irradiation is carried out accordingly. In this way, a high-performance poly-Si film having a large grain diameter can be obtained. TFTs having high mobility can be obtained by forming TFFs with use of such a high-performance poly-Si film.

Also in the present embodiment, irradiated areas 19 are irradiated with flat-surface light substantially in parallel with the major axis of the elongate beam (i.e., a direction perpendicular to the scanning direction). From periodicity of changes in luminance of the reference color, the threshold value of micro-crystallization of a poly-Si film is determined. Thus, flat-surface light is irradiated substantially in parallel with the major axis of the beam. Therefore, the micro-crystallization threshold value of a poly-Si film can be determined with superior reliability and reproducibility, while reducing the influence by scattering of light. According to the present embodiment, a laser irradiation technique and a laser irradiation apparatus which realize formation of a poly-Si film with a high throughput can be provided by automatically determining the energy density of the pulse laser light which is slightly below the micro-crystallization threshold value.

Described next will be a first example of the present invention. In this example, an $SiO_2$ film of 2000 Å was formed on a glass substrate of 550 mm×650 mm. An a-Si film of 600 Å was formed thereon. Thereafter, a plurality of irradiated areas 19 were formed within a preliminary irradiation area 20 by irradiating an excimer laser beam onto a peripheral portion of the substrate. Within the preliminary irradiation area 20, generation frequency was set to 300 Hz, and the size of the laser beam was set to 30 mm×0.4 mm by masking a linear beam of 275 mm×0.4 mm. Scanning pitch was set constant at 0.1 mm. Energy density was changed at intervals of 10 $mJ/cm^2$ from 470 $mJ/cm^2$ to 510 $mJ/cm^2$. For each energy density, scanning irradiation width was set to 1 cm.

The irradiated areas 19 thus formed were irradiated with white flat-surface estimation light substantially in parallel with the major axis of the beam, and reflected light therefrom was received by a color CCD. A 50-time-magnification lens was set in front of the color CCD, and adjustment was made so that the resolution thereof was 0.3 μm. The color of obtained image was constant and yellow substantially throughout the whole surface of the irradiated area 19 where the energy density was set at 470 $mJ/cm^2$. With 480 $mJ/cm^2$, linear red areas were non-periodically observed in yellow areas. The red areas have the color of reflected light from micro-crystallized areas, which differs from the yellow of the areas of coarse crystal grains. On the image, changes in luminance along a segment parallel to the minor axis of the beam were obtained and exhibited changes similar to the graph (b) of FIG. 5.

In the irradiated area 19 formed with an energy density of 490 $mJ/cm^2$ or above, linear yellow areas and linear red areas alternately appeared periodically. There was a tendency that the width of the yellow areas were narrowed as the energy density increased. Likewise, changes in luminance with yellow areas along a segment parallel to the minor axis of the beam on the image were obtained, and exhibited changes similar to the graph of FIG. 5A. Thus, periodic peaks were observed. Inter-peak distances were about 0.1 mm and were equivalent to the scanning pitch. Variation of the inter-peak distances fell in a range of ±7%. Several peaks were observed also in the irradiated area 19 where the energy density was set at 480 $mJ/cm^2$. However, the inter-peak distances thereof were not constant.

From the above evaluation results, the micro-crystallization threshold value of the poly-Si film was determined to be 490 $mJ/cm^2$, and main irradiation was carried out over the whole substrate surface. Conditions of the main irradiation were as follows. The generation frequency was kept intact at 300 Hz. The beam size was returned to 275 mm×0.4 mm. The scanning pitch was set as fine as 0.04 mm. Adopted energy density was 470 $mJ/cm^2$ as a value not greater than the determined micro-crystallization threshold value of 490 $mJ/cm^2$. Under these conditions, the main irradiation was carried out to prepare TFTs with use of a poly-Si film. As a result, TFTs having an average mobility of 260 $cm^2/Vs$, a range of variation within 5%, and high uniformity were prepared.

As a comparative example, the main irradiation was carried out with an energy density determined based on the micro-crystallization threshold value of an a-Si film. Under the conditions for carrying out this example, the micro-crystallization threshold value obtained by one-shot irradiation (FIG. 4A) was 430 $MJ/cm^2$. The main irradiation was carried out with an energy having an energy density not greater than the determined energy density, to prepare TFTs. The mobility stayed at 140 $cm^2/Vs$. The energy density in the main irradiation may be matched with desired TFT characteristics. However, TF's having mobility beyond 140 $cm^2/Vs$ can hardly be obtained with excellent reliability and reproducibility, in case of setting the energy density in the main irradiation on the basis of the micro-crystallization threshold value of the a-Si film.

In this example, the scanning pitch was changed between the preliminary irradiation area and the main irradiated areas on the following grounds. That is, TFT characteristics and uniformity thereof depend on the scanning pitch. As the pitch decreases, the uniformity improves. However, the throughput of irradiation process lowers if the pitch is made smaller. For the main irradiated areas, a scanning pitch of 0.04 mm was determined in order to prioritize the TFT characteristics. On the other hand, with respect to the preliminary irradiation area, only the micro-crystallization threshold value of a poly-Si film needs to be determined. Greater scanning pitch is more desirable on the throughput. If the pitch is excessively large, the number of pulses irradiated on the preliminary irradiation area decreases so that the micro-crystallization threshold value is difficult to determine with sufficient reliability in some cases. Taken into consideration these points, the pitch for the preliminary irradiation area was set to 0.1 mm which was about several times larger than that for the main irradiated areas.

The laser size was also changed between the preliminary irradiation area and the main irradiated areas in order to raise the yield of TFT products. Since the preliminary irradiation area is not suitable for product manufacture, this area is to waste. Therefore, irradiation should desirably be effected only on as small an area as possible for determination of the micro-crystallization threshold value. From this reason, irradiation was carried out on the preliminary irradiation area with the beam size or particularly the beam size in the major axis direction reduced.

A second example of the present invention will now be described. The second example adopts a high-performance TFT manufacturing technique in which an a-Si film is formed to have a film thickness variation, as described in JP-A-2003-332346. Like in the first example, an $SiO_2$ film of 2000 Å was formed on a glass substrate. An a-Si film of 800 Å was formed thereon. A resist was selectively deposited thereon, and dry etching was carried out, to selectively form thin film areas having film thickness of 500 Å. Thereafter, similarly to the first example, a preliminary irradiation area 20 was formed. At this time, the energy density of the laser beam was changed at intervals of 10 $mJ/cm^2$ from 400 $mJ/cm^2$ to 450 $mJ/cm^2$.

Next, similarly to the first example, the preliminary irradiation area 20 thus formed was irradiated with white flat-surface light, and the reflected light therefrom was received by a color CCD. Measurement of this reflected light was carried out by selecting a spot which formed a thin film having a film thickness of 500 Å and was distant by 7 μm or more from the interface between the thin film and the thick film. Obtained image was constant and purple substantially throughout the whole surface with an energy density up to 420 mJ/cm$^2$. With an energy density of 430 mJ/cm$^2$, blue stripes appeared without periodicity. With an energy density of 440 mJ/cm$^2$ or more, an image on which purple and blue stripes were periodically arranged at a pitch of 0.1 mm was obtained.

From the above evaluated results, the micro-crystallization threshold value of the poly-Si film was determined to be 440 mJ/cm$^2$, and the main irradiation was carried out over the whole substrate surface. Conditions of the main irradiation were as follows. Adopted energy density was 445 mJ/cm$^2$ as a value not smaller than the determined micro-crystallization threshold value of 440 mJ/cm$^2$ of the poly-Si film for the thin film thickness areas. In this example, the main irradiation was thus carried out with an energy density not smaller than the micro-crystallization threshold value of the thin film areas. As a result of this, position-controlled crystal grains were formed, growing toward the thin film portion from the interface between the thin film and the thick film portions. Gates are provided above the position-controlled crystal grains, and TFTs were fabricated. Thus, TFTs with higher performance and higher uniformity were created, wherein the average mobility was 430 cm$^2$/Vs and the range of variation thereof fell in a range of 4%.

A laser irradiation apparatus according to a second embodiment of the present invention has a structure to similar that of the laser irradiation apparatus of the first embodiment, except that the optical resolution of the CCD light-sensitive element 16 in the second embodiment is coarser than the width of the portion of the coarse crystal grains in the scanning direction. The optical resolution of the CCD light-sensitive element 16, which is coarser than the width of the portion of the coarse crystal grains in the scanning direction, does not allow the color changes between the micro-crystallized portions and portions of the coarse crystal grains to be distinguished clearly based on the image obtained by receiving the reflected light from the irradiated area. That is, substantially only colors of the micro-crystallized portions are detected.

Figure 7:
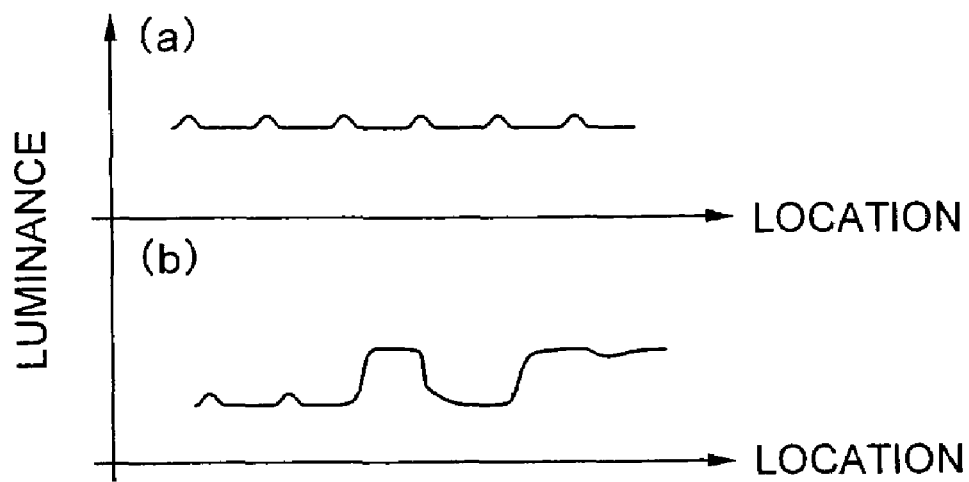
FIG. 7 depicts a graph showing the change in luminance of the reflected light received by the CCD light-sensitive element.

FIG. 7 shows changes in luminance of the reference color of the light received by the CCD light-sensitive element 16. For achieving the state shown by graph (b) in FIG. 4, the scanning irradiation is carried out to prepare the irradiated areas 19. The reflected light from the irradiated areas 19 is received by the CCD light-sensitive element 16, whereby the luminance of the reference color of the light received by the CCD light-sensitive element 16 changes as shown by graph (a) in FIG. 7. In this case, substantially only the color of the micro-crystallized portions is observed, and substantially constant colors appear with a relatively fine periodicity within a single period. This allows a uniform color to be observed over the entire areas.

For achieving the state shown by graph (c) in FIG. 4, scanning irradiation is carried out to prepare the irradiated areas. The reflected light from the irradiated areas is received by the CCD light-sensitive element 16. Luminance of the reference color of the light received by the CCD light-sensitive element 16 changes as shown by graph (b) in FIG. 7. In this case, the non-micro-crystallized area obtained by the pulse intensity not larger than the micro-crystallization threshold value is observed to have a color different from that of the micro-crystallized portion, on a CCD image. As a result, the non-micro-crystallized portion is expressed as a wide color-change peak having a clear size.

As described above, the degree of color change differs between the case where the energy density of the irradiation pulse is not smaller than the micro-crystallization threshold value and the case where the energy density is smaller than the micro-crystallization threshold value. In the present embodiment, the micro-crystallization threshold value is determined depending on the size of the width of the color change of the reference color. Thereafter, the energy density to be used in the main irradiation is determined based on the thus determined threshold value of micro-crystallization, similarly to the first embodiment. Thus, a poly-Si film having a large grain diameter can be obtained.

In general, if the resolution of the CCD is low, the depth of focus increases. Therefore, if a CCD having a lower optical resolution is adopted as the CCD light-sensitive element 16, an advantages lies in that determination of the threshold value of micro-crystallization is less influenced by changes in thickness of the substrate. Another advantage is obtained in that costs for the apparatus can be reduced.

Next, a third example of the present invention will be described. Like in the first example, an SiO$_2$ film and an a-Si film were formed on a glass substrate. Preliminary irradiation was then carried out to form irradiated areas 19. Thereafter, each of the irradiated areas 19 was irradiated with white flat-surface light, and the reflected light was received by a CCD. At this time, a 5-time magnification lens was set in front of the CCD, and adjustment was made so as to obtain a resolution of 3 μm. The obtained image was constant and yellow substantially throughout the whole surface of the irradiated area 19 where the energy density was set to 470 mJ/cm$^2$. With an energy density of 480 mJ/cm$^2$, broad red stripes were observed without periodicity in yellow areas. Luminance distribution using yellow as the reference color exhibited graph (b) as shown in FIG. 7. With an energy density of 490 mJ/cm$^2$ or above, substantially the entire surfaces were observed as red. Luminance distribution using yellow as the reference color exhibited graph (a) as shown in FIG. 7.

Figure 8:
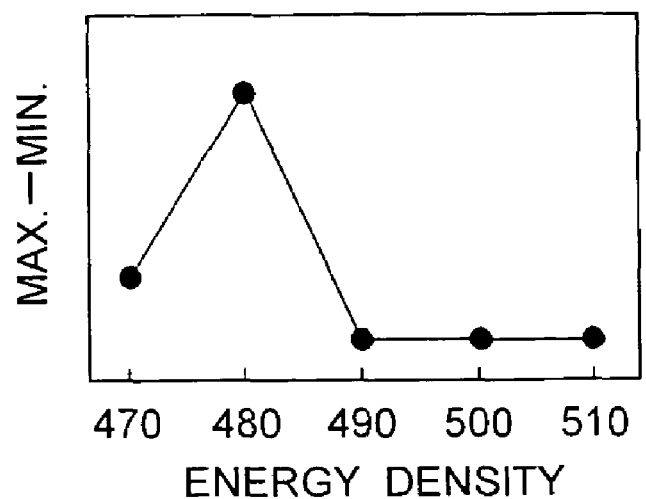
FIG. 8 depicts a graph showing the relationship between the energy density and a difference between maximum luminance and minimum luminance of the reflected light.
Figure 9:
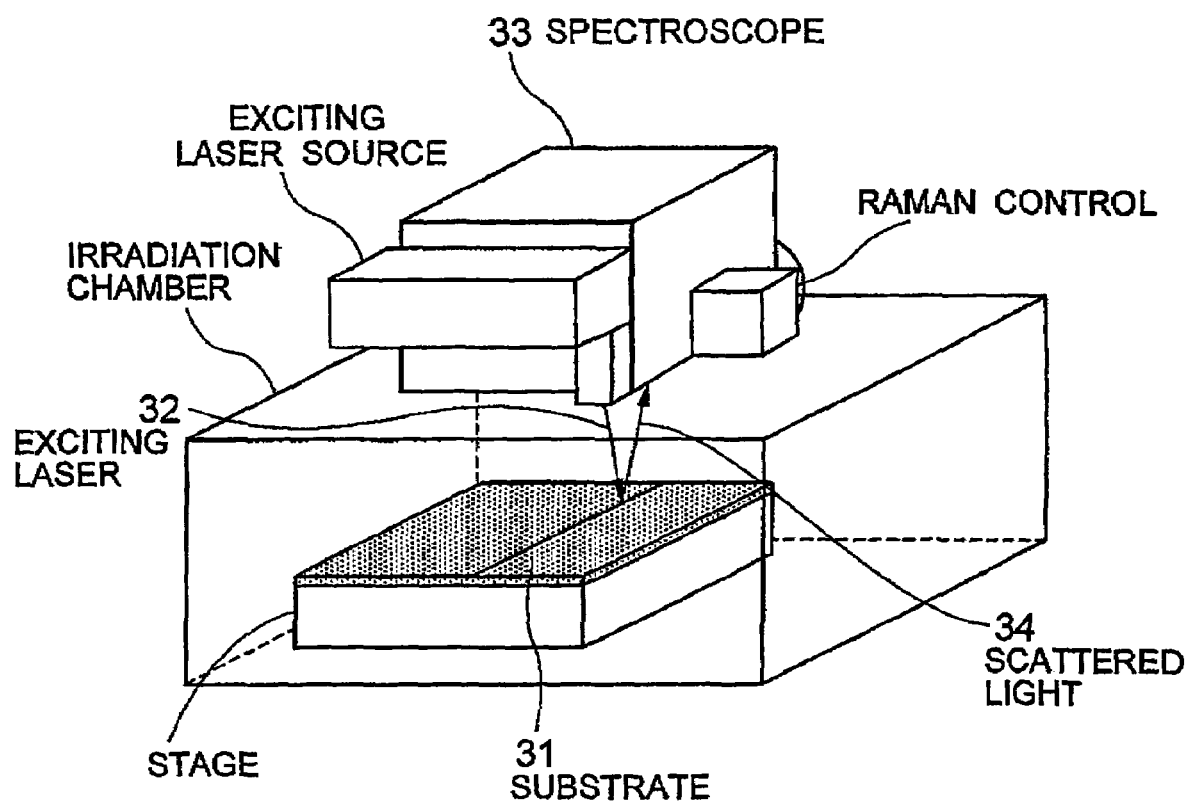
FIG. 9 is a three-dimensional perspective view showing the structure of a conventional laser annealing apparatus.

For each of the irradiated areas 19, the difference between maximum intensity and the minimum intensity of the luminance data was obtained. As shown in FIG. 8, a large value is obtained at an irradiated area 19 where the energy density was set to 480 mJ/cm$^2$. Thereafter, the difference drops at another irradiated area where the energy density was set to 490 mJ/cm$^2$. The energy density of 490 mJ/cm$^2$ at which the difference dropped after once having had risen was determined to be the micro-crystallization threshold value.

Thereafter, the main irradiation was carried out similarly to the first example. As the energy density in the main irradiation, 450 mJ/cm$^2$ was adopted as a value not larger than the determined micro-crystallization threshold value of 490 mJ/cm$^2$. TFTs were prepared with use of the poly-Si film obtained by the main irradiation. Mobility of the TFTs was 180 cm$^2$/Vs and had variation within a range of 5% or less.

In the above embodiments, descriptions have been made of an example in which the laser irradiation and determination of the micro-crystallization threshold value are performed on a single substrate stage. The present invention is not limited to these examples. A plurality of different substrate stages may be used respectively in processing steps. If different stages are used, the size of the apparatus will be increased. However, the size of the light source and the CCD light sensitive element can be increased without limitations from other components. Therefore, the micro-crystallization threshold value can be determined with much better reliability and reproducibility. In addition, preliminary irradiation areas and main irradiation areas need not necessarily be formed on a single substrate.

The micro-crystallization threshold value may be determined by forming preliminary irradiation areas on another substrate having a film thickness substantially equal to that of a substrate where the main irradiated areas are formed.

In the above examples, the present invention has been described on the basis of preferred embodiments thereof. The laser irradiation technique and laser irradiation apparatus according to the present invention are not limited to the above embodiments. The scope of the present invention should be considered as including those techniques and apparatuses that would be derived by making various changes and modifications to the structures of the above embodiments and examples.

What is claimed is:

1. A method for changing a phase of a semiconductor layer from an amorphous state to a crystal state, comprising the steps of:
    irradiating an elongate first pulse laser beam having a specific generation frequency onto a semiconductor layer with a plurality of different energy densities while scanning in a direction normal to a major axis of said first pulse laser beam, to thereby form a plurality of first irradiated areas corresponding to said different energy densities;
    irradiating a flat-surface light onto said first irradiated areas in a direction substantially parallel to said major axis of said first pulse laser beam, to receive reflected light from each of said first irradiated areas;
    analyzing said reflected light to estimate a threshold value of a micro-crystallization energy density by determining a color distribution from said reflected light in a direction normal to said major areas of said first pulse laser beam, and judging a distance between adjacent peaks of color change and/or uniformity of said color change;
    determining a first energy density based on said estimated threshold value; and
    irradiating an elongate second pulse laser beam having said specific generation frequency onto the semiconductor layer with said first energy density while scanning in a direction normal to a major axis of said second pulse laser beam, to form a second irradiated area.

2. The method according to claim 1, wherein a scanning pitch of said first pulse laser beam in each of said first irradiated areas is longer than a scanning pitch of said second pulse laser beam in said second irradiated area.

3. The method according to claim 1, wherein said first pulse laser beam has a beam size smaller than a beam size of said second pulse laser beam.

4. The method according to claim 1, wherein said threshold value is estimated based on a periodicity of said reflected light in said determining step.

5. The method according to claim 1, wherein said threshold value is estimated by the steps of determining a color distribution from said reflected light in a direction normal to said major axis, and a width of a color in said color distribution.

6. A method for changing a phase of a semiconductor layer from an amorphous state to a crystallized state, comprising the steps of:
    irradiating an elongate first pulse laser beam having a specific generation frequency onto a semiconductor layer with a plurality of different energy densities while scanning in a direction normal to a major axis of said first pulse laser beam, to thereby form a plurality of first irradiated areas corresponding to said different energy densities;
    irradiating a flat-surface light onto said first irradiated areas in a direction substantially parallel to said major axis of said first pulse laser beam, to receive reflected light from each of said first radiated areas;
    analyzing said reflected light to estimate a threshold value of a micro-crystallization energy density wherein said threshold value is estimated by the steps of determining a color distribution from said reflected light in a direction normal to said major axis, and a width of a color in said color distribution;
    determining a first energy density based on said estimated threshold value; and
    irradiating an elongate second pulse laser beam having said specific generation frequency onto the semiconductor layer with said first energy density while scanning in a direction normal to a major axis of said second pulse laser beam, to form a second irradiated area.

7. The method according to claim 6, wherein a scanning pitch of said first pulse laser beam in each of said first irradiated areas is longer than a scanning pitch of said second pulse laser beam in said second irradiated area.

8. The method according to claim 6, wherein said first pulse laser beam has a size smaller than a beam size of said second pulse laser beam.

9. The method according to claim 6, wherein said threshold value is estimated based on a periodicity of said reflected light in said determining step.

* * * * *